(12) United States Patent
Sawano

(10) Patent No.: US 7,865,860 B2
(45) Date of Patent: Jan. 4, 2011

(54) LAYOUT DESIGN DEVICE AND LAYOUT METHOD

(75) Inventor: Tomoki Sawano, Tokyo (JP)

(73) Assignee: NEC Corporation, Tokyo (JP)

( * ) Notice: Subject to any disclaimer, the term of this patent is extended or adjusted under 35 U.S.C. 154(b) by 333 days.

(21) Appl. No.: 12/059,307

(22) Filed: Mar. 31, 2008

(65) Prior Publication Data

US 2008/0244496 A1   Oct. 2, 2008

(30) Foreign Application Priority Data

Mar. 30, 2007   (JP) .............................. 2007-090032

(51) Int. Cl.
 *G06F 17/50* (2006.01)
(52) U.S. Cl. .............................. 716/12; 716/13; 716/14
(58) Field of Classification Search .................... 716/12, 716/13, 14
 See application file for complete search history.

(56) References Cited

U.S. PATENT DOCUMENTS

| | | | |
|---|---|---|---|
| 6,507,941 B1 * | 1/2003 | Leung et al. .................. | 716/14 |
| 6,950,998 B1 * | 9/2005 | Tuan .............................. | 716/2 |
| 7,360,193 B1 * | 4/2008 | Burstein et al. ............... | 716/10 |
| 7,464,359 B2 * | 12/2008 | Habitz et al. .................. | 716/14 |
| 7,555,741 B1 * | 6/2009 | Milton et al. ................. | 716/16 |
| 2007/0220473 A1 * | 9/2007 | Goto .......................... | 716/11 |
| 2007/0226673 A1 * | 9/2007 | Habitz et al. .................. | 716/14 |
| 2009/0241079 A1 * | 9/2009 | Binder et al. .................. | 716/6 |

FOREIGN PATENT DOCUMENTS

JP   09269958 A   10/1997

* cited by examiner

*Primary Examiner*—Vuthe Siek
*Assistant Examiner*—Magid Y Dimyan

(57) ABSTRACT

A layout design device according to an exemplary aspect of the present invention is a layout design device for designing layout of an integrated circuit, including a routing section for adjacently wiring a signal line having a high activity rate and a signal line having a low activity rate based on an activity rate of the signal line of each circuit element.

6 Claims, 3 Drawing Sheets

LAYOUT DESIGN DEVICE AND LAYOUT METHOD

INCORPORATION BY REFERENCE

This application is based upon and claims the benefit of priority from Japanese patent application No. 2007-090032, filed on Mar. 30, 2007, the disclosure of which is incorporated herein in its entirety by reference.

BACKGROUND OF THE INVENTION

1. Field of the Invention

The present invention relates to a layout design device and a layout method, and particularly, it relates to a layout design device for designing layout of a semiconductor integrated circuit.

2. Description of the Related Art

In general, a layout such as the placement of a circuit element in an LSI logic circuit, and a routing are performed by a CAD system using a computer. Usually, the CAD system (hereinafter, referred to as layout design device) of this type performs an analysis of resistance of wire and capacitance of the wire from layout information when the layout design of the logic circuit is performed, and carries out a computation of the flowing current and noise. The layout design device of this type verifies whether the current and noise satisfy a reference in order that the circuit does not cause an error due to noise and EM.

The layout design device of this type performs an automatic placement and routing (P&R) processing based on information concerning connection between logic circuits, thereby realizing the shortening of a total wire length and the improvement of wirability. When an error of the signal line is detected in a signal integrity analysis after the placement and routing, the error is removed by performing a correction of the placement and routing as an additional processing and by executing the layout design again by correcting the connection information.

Further, with respect to a clock and an important signal liable to cause the malfunction of a circuit, an error is corrected by preferably making the signal line as short as possible by performing the routing processing prior to an ordinary signal or by shielding the noise from the ordinary signal by performing a shield by a power supply wire after the routing or by reducing the capacity with the ordinary wire by causing blockage such that no ordinary wire is adjacent to the important wire.

Further, a layout design device has been also proposed, in which the noise error is corrected by using the automatic placement and routing means provided with the signal integrity analyzing means. In the layout design device of this type, without changing information concerning connection between logic circuits, an error is corrected by contriving the placement of the circuit element and the method of the routing processing and the like. Japanese Patent Laid-Open No. 09-269958 discloses a method of dispersedly wiring the signal lines of a highly active degree inside the circuit.

In the technique of Japanese Patent Laid-Open No. 09-269958, based on the active degree of the signal lines inside the circuit, the signal lines of highly-active degree are dispersedly wired, and it is, therefore, necessary to secure a useless wiring space by causing blockage such that the signal lines of highly-active degree are not adjacent to each other, and this often causes a difficulty in performing wiring at high density.

SUMMARY OF THE INVENTION

An exemplary object of the present invention is to provide a layout design device and a layout method capable of performing wiring at high density.

A layout design device according to an exemplary aspect of the present invention is a layout design device for designing layout of an integrated circuit, including a routing section for adjacently wiring a signal line having a high activity rate and a signal line having a low activity rate based on an activity rate of the signal line of each circuit element.

A layout method according to an exemplary aspect of the present invention is a layout method for designing layout of an integrated circuit, including: adjacently wiring a signal line having a high activity rate and a signal line having a low activity rate based on an activity rate of the signal line of each circuit element.

A layout design device according to an exemplary aspect of the present invention is a layout design device for designing layout of an integrated circuit, including routing means for adjacently wiring a signal line having a high activity rate and a signal line having a low activity rate based on an activity rate of the signal line of each circuit element.

DETAILED DESCRIPTION OF THE EXEMPLARY EMBODIMENT

Hereinafter, an exemplary embodiment of the present invention will be described with reference to the drawings.

Figure 1:
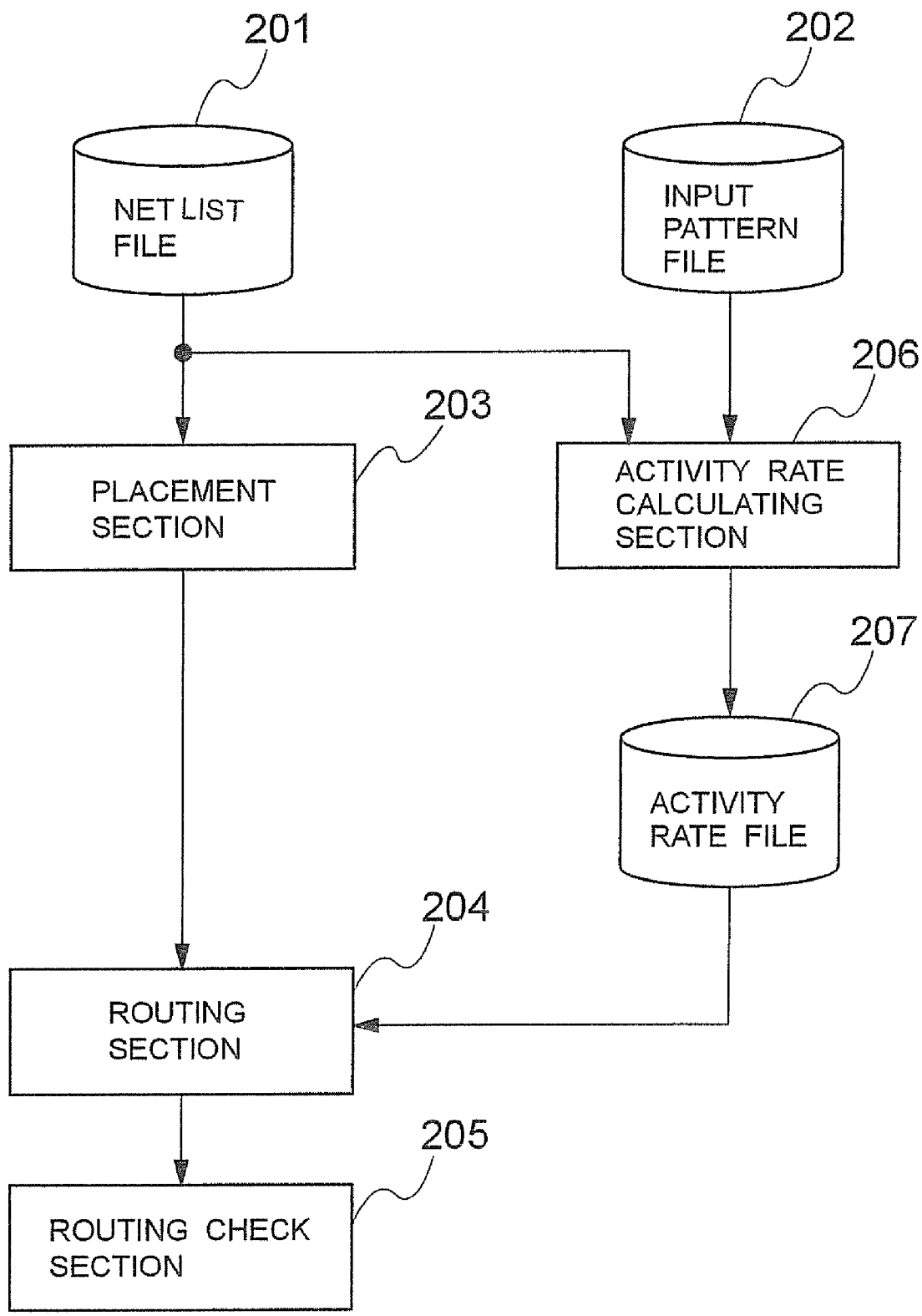
FIG. 1 is a view showing the configuration of a layout design device according to an exemplary embodiment of the present invention.

FIG. 1 is a view showing the configuration of a layout design device according to the exemplary embodiment of the present invention. In FIG. 1, the layout design device according to the exemplary embodiment of the present invention includes a netlist file 201 storing a netlist, an input pattern file 202 of the input signal of a layout target circuit, an activity rate file 207, a placement section 203, a routing section 204, a routing check section 205, and an activity rate calculating section 206.

The activity rate calculating section 206, based on the netlist file 201 and the input pattern file 202, calculates the activity rate (transition probability) of each net by a logic simulation or a clock definition, and stores it into the activity rate file 207. The placement section 203 performs the placement of the circuit elements based on the netlist file 201. The routing section 204 performs the wiring of a net between the elements, and performs wiring such that the net having a high activity rate is adjacent to the net having a low activity rate based on the activity rate of each net stored in the activity rate file 207. The routing check section 205 checks the wiring result.

Figure 2:
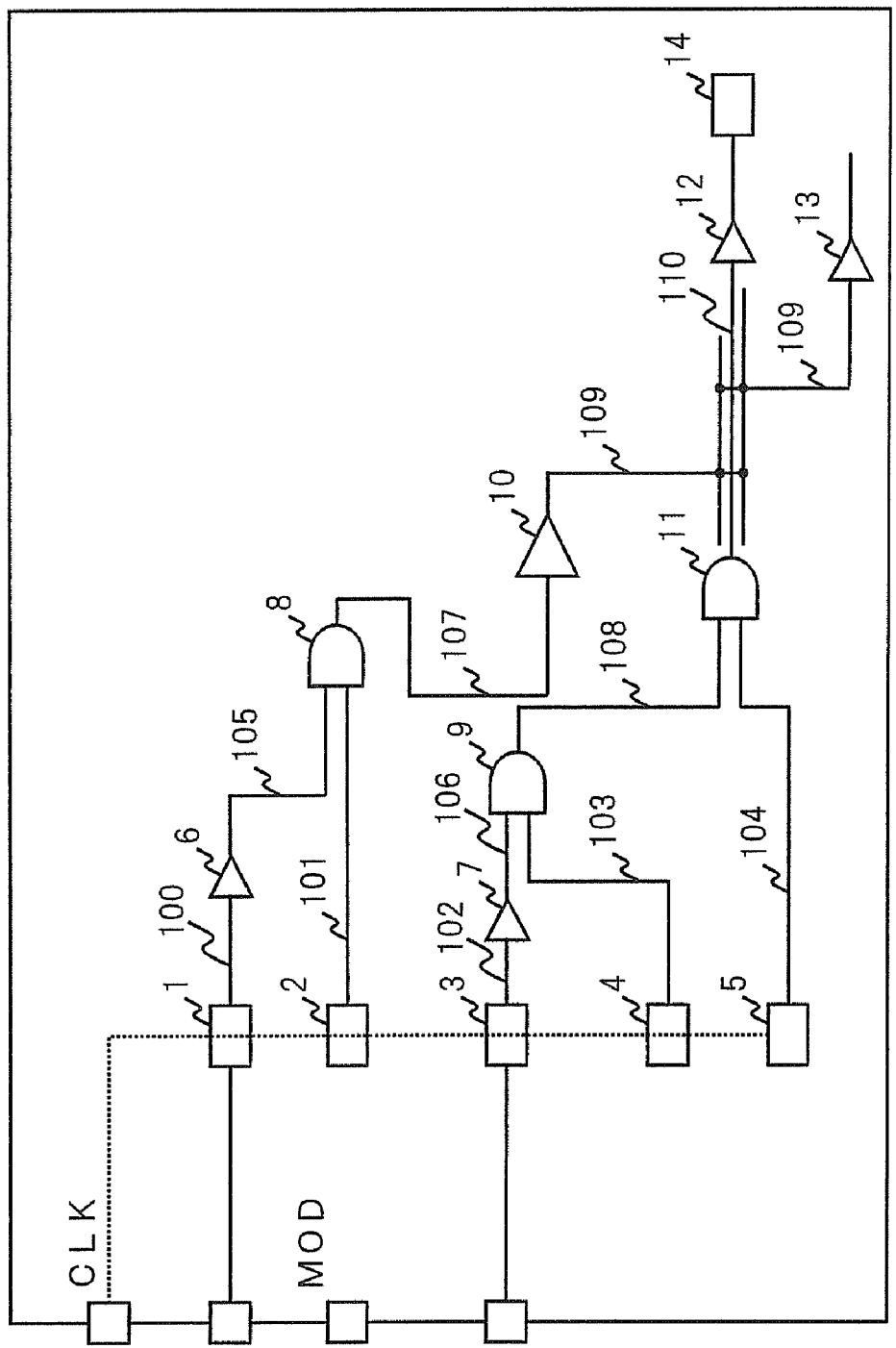
FIG. 2 is a view showing one example of the result of the layout design according to the exemplary embodiment of the present invention.

FIG. 2 is a view showing one example of the result of the layout design according to the exemplary embodiment of the present invention. The logic circuit shown in FIG. 2 includes flip flops 1 to 5 and 14, gates 8 to 11, and buffers 6, 7, 12, and 13, and is formed by connecting them by nets 100 to 110 and the like.

The activity rate of this circuit is determined by the logic simulation or the clock definition. A clock signal CLK is common to the flip flops 1 to 5, and therefore, when the activity rate is determined from the clock frequency, output nets 100 to 104 of each flip flop have the same activity rate, and even when passing through buffers 6 and 7 subsequently, the activity rate does not change, so that the nets 105 and 106 have also the same activity rate. When passing through the gates 8 and 9, the activity rate of each of the nets 107 and 108 becomes an activity rate (usually the same as or smaller than the activity rate of the input signal) calculated from the logic of each of the gates 8 and 9.

At this time, it is possible to calculate the activity rate in a specific operation mode according to the logical meaning of the circuit. For example, the circuit starting from the flip flops 3 to 5 is a circuit portion for operating in the normal operation mode for performing the normal operation, and the circuit starting from the flip flops 1 and 2 is a circuit portion for operating in the test operation mode for performing the test operation. The normal operation mode and the test operation mode are changed over by the value of an MOD signal inputted from the outside.

Consequently, in this case, in the normal operation mode, the activity rate of each of the nets 102 to 104, 106, 108, and 110 included in the circuit starting from the flip flops 3 to 5 is an activity rate determined from the above described calculation, and the activity rate of each of the nets 100, 101, 105, 107, and 109 included in the circuit starting from the flip flops 1 and 2 is 0. Further, in the test operation mode, the activity rate of each of the nets 102 to 104, 106, 108, and 110 included in the circuit starting from the flip flops 3 to 5 is 0, and the activity rate of each of the nets 100, 101, 105, 107, and 109 included in the circuit starting from the flip flops 1 and 2 is the activity rate determined from the above described calculation.

The routing section 204 performs wiring such that the net having a high activity rate is adjacent to the net having a low activity rate based on the activity rate of each net in the specific operation mode. In the example shown in FIG. 2, in the specific operation mode (for example, the normal operation mode), the nets 108 and 110 having the activity rate higher than a predetermined value are wired adjacent to the nets 107 and 109 having the activity rate lower than a predetermined value, respectively.

As described above, the nets 108 and 107 and the nets 110 and 109 are unlikely not to operate at the same time or to operate at the same time. A cross-talk noise between the wires among the noises of the circuit is arisen as a result of causing a voltage change in the target wire through the capacitance between the wires by the operation (potential change) of the signal serving as a noise source. However, this noise is temporal and disappears when the current flows to the gate which drives the affected wire, and therefore, when that signal does not perform a meaningful operation at that timing, there is no problem even if the noise arises.

Further, the effect of the noise is proportional to a wiring completion amount with the signal serving as a noise source, and is inversely proportional to a total capacity including a capacity versus power supply of the net. However, when the target net is adjacent to a plurality of signals, and is affected by these signals, if the part of the signals is not operated at that timing, it is taken similarly as being adjacent to the power supply, so that the effect of the noise is reduced. As a result, a highly reliable circuit layout can be obtained. In addition, the effect given by the noise to the delay can be reduced, thereby contributing to the improvement of the performance.

The routing section 204 may use a net allowed being adjacent and having a low activity rate as a shield wire of the net having a high activity rate. That is, when the signal of the net having a high activity rate is important, and requires a power supply shield for suppressing the noise to the minimum limit, and when the activity rate of the signal wire adjacent to the net having a high activity rate is sufficiently low, instead of performing the shield wiring, the signal wire is redundantly pulled around so as to replace the shield. This is effective when the wire allowed being adjacent does not cause a problem by delay similarly to the signals of the clamping, the initial setting, and LSI test. In the example shown in FIG. 2, the net 109 having a low activity rate is used as the shield wire of the net 110 having a high activity rate.

Figure 3:
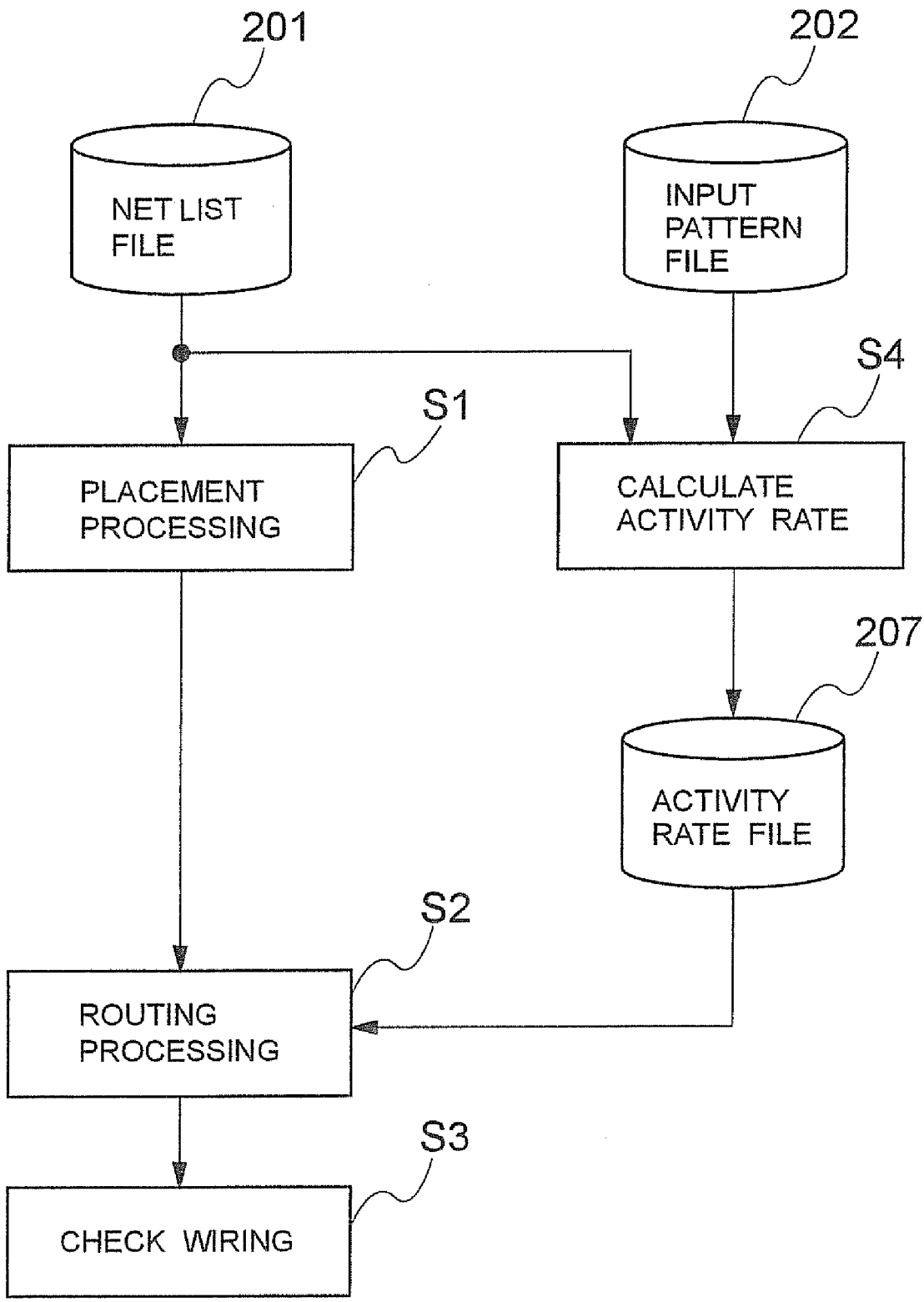
FIG. 3 is a flowchart showing the operation of the layout design device according to the exemplary embodiment of the present invention.

FIG. 3 is a flowchart showing the operation of the layout design device according to the exemplary embodiment of the present invention. The operation of the layout design device according to the exemplary embodiment of the present invention will be described by using FIGS. 1 to 3.

In FIG. 3, the placement section 203, based on the netlist file 201, performs the placement of the circuit elements (the flip flops 1 to 5 and 14, the gates 8 to 11, and the buffers 6, 7, 12 and 13) (step S1). The activity rate calculating section 206, based on the netlist file 201 and the input pattern file 202, calculates the activity rate of each net every operation mode, and stores it in the activity rate file 207 (step S4).

The routing section 204 performs a global routing from the placement result of the placement section 203, and then performs a detailed routing (step S2). When performing the detailed routing, the routing section 204, based on the activity rate file 207, disposes a net having a low activity rate in the specific operation mode adjacent to a net having a high activity rate in the specific operation mode. The routing check section 205 checks the wiring result (routing result) and performs a wiring correction if necessary (step S3).

As described above, in the exemplary embodiment of the present invention, based on the activity rate of each net in the specific operation mode, the net having a high activity rate and the net having a low activity rate are adjacently wired, and therefore, the necessity of securing a useless wiring space by banning being adjacent is reduced, so that it is possible to perform wiring at high density. Further, using the net allowed being adjacent and having a low availability radio as a shield wire is also effective for the high density.

In the exemplary embodiment of the present invention, while the activity rate calculating section 206 calculates the activity rate every operation mode, the activity rate calculating section 206 may calculate the activity rate in a predetermined period, and based on the activity rate in the predetermined period, the routing section 204 may decide the wires to be allowed being adjacent. For example, the activity rate calculating section 206 may calculate the activity rate of each net in a predetermined period within a clock cycle. In this case, the activity rate calculating section 206 checks within which time from the clock timing a signal is likely to operate by performing a delay simulation of the circuit, so that the activity rate in the specific period within the clock cycle can be individually determined.

Further, in the exemplary embodiment of the present invention, based on the activity rate of each net, the routing section 204 decides the wires allowed being adjacent. However, the routing check section 205 may perform this decision when the wiring correction is performed by performing a check of the noise for the wiring result. Further, prior to the layout design according to the exemplary embodiment of the present invention, the activity rate file 207 may be prepared in advance.

An exemplary advantage according to the invention is that it is possible to perform wiring at high density.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A layout design device for designing layout of an integrated circuit, comprising a routing section for adjacently wiring a first signal line having a high activity rate and a second signal line having a low activity rate based on an activity rate of the signal line of each circuit element,
   wherein the activity rate is determined by logic simulation or by clock definition,
   wherein the first signal line connects a first circuit component to a second circuit component, the second circuit component being different than the first circuit component,
   wherein the second signal line connects a third circuit component to a fourth circuit component, the third circuit component being different than the second circuit component and the first circuit component, the fourth circuit component being different than the third circuit component, the second circuit component, and the first circuit component, and
   wherein the routing section adjacently wires the first signal line and the second signal line without regards to which circuit components the first signal line interconnects and without regards to which circuit components the second signal line interconnects.

2. The layout design device according to claim 1, wherein said signal line having a low activity rate is used as a shield wire of said signal line having a high activity rate.

3. The layout design device according to claim 1, wherein said activity rate is an activity rate in a predetermined period of time in an operation clock cycle of said integrated circuit.

4. A layout method for designing layout of an integrated circuit, comprising:
   adjacently wiring, using a layout design device, a first signal line having a high activity rate and a second signal line having a low activity rate based on an activity rate of a signal line of each circuit element; and,
   constructing the integrated circuit using the layout,
   wherein the activity rate is determined by logic simulation or by clock definition,
   wherein the first signal line connects a first circuit component to a second circuit component, the second circuit component being different than the first circuit component,
   wherein the second signal line connects a third circuit component to a fourth circuit component, the third circuit component being different than the second circuit component and the first circuit component, the fourth circuit component being different than the third circuit component, the second circuit component, and the first circuit component, and wherein the routing section adjacently wires the first signal line and the second signal line without regards to which circuit components the first signal line interconnects and without regards to which circuit components the second signal line interconnects.

5. The layout method according to claim 4, wherein said signal line having a low activity rate is used as a shield wire of said signal line having a high activity rate.

6. The layout method according to claim 4, wherein said activity rate is an activity rate in a predetermined period of time in an operation clock cycle of said integrated circuit.

* * * * *